(12) United States Patent
Sato et al.

(10) Patent No.: US 12,552,124 B2
(45) Date of Patent: Feb. 17, 2026

(54) SUBSTRATE PROCESSING APPARATUS

(71) Applicant: TDK CORPORATION, Tokyo (JP)

(72) Inventors: Yohei Sato, Tokyo (JP); Osamu Shindo, Tokyo (JP); Hiroshi Koizumi, Tokyo (JP); Makoto Yamashita, Tokyo (JP); Yasuo Kato, Tokyo (JP); Mitsuyoshi Makida, Tokyo (JP); Masashi Matsumoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 291 days.

(21) Appl. No.: 18/323,467

(22) Filed: May 25, 2023

(65) Prior Publication Data

US 2023/0382069 A1 Nov. 30, 2023

(30) Foreign Application Priority Data

May 26, 2022 (JP) ................. 2022-086030

(51) Int. Cl.
*B30B 12/00* (2006.01)
*B30B 15/04* (2006.01)
*B30B 15/06* (2006.01)

(52) U.S. Cl.
CPC .............. *B30B 12/00* (2013.01); *B30B 15/04* (2013.01); *B30B 15/062* (2013.01)

(58) Field of Classification Search
CPC ........ B30B 12/00; B30B 15/04; B30B 15/062
See application file for complete search history.

(56) References Cited

U.S. PATENT DOCUMENTS

| | | | |
|---|---|---|---|
| 2003/0205333 A1* | 11/2003 | Hayafuji | B30B 15/0064 156/580 |
| 2004/0109124 A1* | 6/2004 | Masuda | B32B 37/10 349/153 |
| 2005/0039856 A1* | 2/2005 | Kubota | B32B 39/00 156/538 |
| 2005/0089597 A1* | 4/2005 | Ito | B32B 37/10 425/388 |
| 2008/0047651 A1* | 2/2008 | Park | H01J 9/241 156/60 |
| 2008/0054921 A1 | 3/2008 | Kimura et al. | |
| 2009/0153146 A1 | 6/2009 | Kimura et al. | |
| 2012/0024456 A1* | 2/2012 | Lin | H01L 21/67109 156/64 |
| 2012/0247664 A1 | 10/2012 | Kobayashi | |
| 2014/0332147 A1 | 11/2014 | Nakamura et al. | |

FOREIGN PATENT DOCUMENTS

| | | |
|---|---|---|
| JP | 2010-232234 A | 10/2010 |
| JP | 2022027150 A | 2/2022 |
| KR | 1020070033469 A | 3/2007 |
| KR | 10-2012-0109963 A | 10/2012 |
| KR | 10-2014-0132679 A | 11/2014 |

* cited by examiner

*Primary Examiner* — Seahee Hong
(74) *Attorney, Agent, or Firm* — Oliff PLC

(57) ABSTRACT

Provided is a substrate processing apparatus capable applying a uniform load to an object to be pressurized. The substrate processing apparatus includes a lower jig plate 46 for arranging a substrate 2 which is an object to be pressurized, an upper jig plate 44 applying pressure to the substrate 2 arranged to the lower jig plate 46, and a support member 45 supporting the lower jig plate 46 and providing a support force to the lower jig plate 46 in accordance with a in-plane distribution of a load applied to the lower jig plate 46.

9 Claims, 12 Drawing Sheets

SUBSTRATE PROCESSING APPARATUS

BACKGROUND OF THE INVENTION

The present disclosure relates to a substrate processing apparatus for processing a substrate, for example, on which a plurality of elements is arranged.

In a technology of forming an element array including a plurality of elements on a substrate, to improve mechanical bonding strength and bonding stability between the plurality of elements and the substrate, a substrate processing apparatus is used to press the plurality of elements using a flat plate against the substrate on which the plurality of elements is arranged (Patent Document 1).

As a substrate processing apparatus that executes this type of processing, for example, a substrate processing apparatus which includes, a lower jig plate on which an object to be pressurized (a substrate on which a plurality of elements is arranged) is arranged, and an upper jig plate that pressurizes the object arranged on the lower jig plate is used. When the substrate on which the plurality of elements is arranged is pressed using the upper jig plate while being provided on the lower jig plate, a load is applied to the substrate, and accordingly, the plurality of elements can be pressed against the substrate.

In recent years, a size (height) of an element arranged on a substrate has become as small as about several μm. When parallelism, flatness, and the like of a surface of the lower jig plate or the upper jig plate vary by about several μm, it becomes difficult to apply a uniform load to the plurality of elements on the substrate using the upper jig plate, and a bonding failure may occur between the plurality of elements and the substrate.

Also, when the substrate is pressed using the upper jig plate, the lower jig plate and the like may bend to some degree, and it becomes difficult to apply a uniform load to the substrate. Therefore, when no load is applied, even if parallelism, flatness, and the like of the surfaces of the upper jig plate and the lower jig plate can be secured to some extent, bonding failure may occur between the plurality of elements and the substrate due to non-uniform distribution of load when pressure is applied to the substrate.

[Patent Document 1] Japanese Patent Application Laid-Open No. 2010-232234

BRIEF SUMMARY OF INVENTION

The present disclosure has been made in view of such circumstances, and an object of the present disclosure is to provide a substrate processing apparatus capable of applying uniform load to an object to be pressurized.

In order to achieve the above object, the substrate processing apparatus according to the present disclosure includes a lower jig plate for arranging an object to be pressurized,
an upper jig plate for pressurizing the object arranged on the lower jig plate, and
a support member supporting the lower jig plate and providing the lower jig plate with a supporting force in accordance with an in-plane distribution of a load applied to the lower jig plate.

A substrate processing apparatus according to the present disclosure includes a support member supporting a lower jig plate and providing the lower jig plate with a supporting force in accordance with an in-plane distribution of a load applied to the lower jig plate. For example, at a position where a relatively smaller load is applied to the lower jig plate, by providing a relatively larger supporting force to the lower jig plate by the supporting member, it is possible to make the lower jig plate less likely to bend, and also it is possible to increase the load applied to the lower jig plate. Further, at a position where a relatively larger load is applied to the lower jig plate, a relatively smaller supporting force is provided to the lower jig plate by the supporting member. Thereby, the lower jig plate can bend easily and the load applied to the lower jig plate can be reduced. Thus, bending of the lower jig plate can be adjusted so that the load applied to each position of the lower jig plate is balanced out, and uniform load can be applied to the object.

Note that, as a means to apply uniform load to the object, from the viewpoint of making an amount of bending of the lower jig plate to substantially zero when the load is applied, a means for forming the lower jig plate using a high rigidity material or the like, a means for fixing the lower jig plate to a rigid (high rigidity) frame, or the like may be used. However, when such means are used, size, weight, or cost of the substrate processing apparatus may increase. Also, in the conventional technology, it was technically difficult to suppress the amount of bending of the lower jig plate to several μm or so. In the substrate processing apparatus according to the present disclosure, by allowing the lower jig plate to bend and also by flexibly adjusting the amount of bending of the lower jig plate, uniform load can be applied to the object by a simple means.

The support member may provide the lower jig plate with a support force corresponding to a distribution of heights of the object. The nonuniformity of load applied to the object may be caused by the height distribution of the object. For example, a relatively smaller load may be applied at a position where the height of the object to be pressurized is relatively low, and a relatively larger load may be applied at a position where the height of the object is relatively high (an opposite case of this may also occur). Even in such a case, at a position where the height of the object is relatively low, a relatively larger supporting force is provided by the supporting member to the lower jig plate so that the load applied to the lower jig plate increases, and at a position where the height of the object is relatively high, a relatively small supporting force is provided by the supporting member to the lower jig plate so that load applied to the lower jig plate decreases, thereby load applied to each position of the lower jig plate can be balanced out and load applied to the object can be made uniform.

Preferably, the support member may include columnar members that support the lower jig plate. Regarding the columnar members, physical parameters such as the space between each columnar member, the arrangement position of each columnar member, a diameter, a length, and so on of each columnar member can be adjusted appropriately. By supporting the lower jig plate with the columnar members, it is possible to provide a supporting force to the lower jig plate according to the above-mentioned physical parameters of the columnar members, and it is possible to adjust the bending of the lower jig plate so that load is uniformly applied to the lower jig plate, and uniform load can be applied to the object.

Preferably, the columnar members may be arranged in accordance with an in-plane distribution of the load applied to the lower jig plate. By configuring as such, according to the arrangement of the columnar members, bending of the lower jig plate can be adjusted so that the load is applied to each position of the lower jig plate is balanced out, and uniform load can be applied to the object.

Preferably, the columnar members may be formed of members having different shapes or Young's moduli, and the support member may adjust the in-plane distribution of the load applied to the lower jig plate by the columnar members having properties exhibiting different strain amounts when a certain load is applied. When the columnar members are strained in accordance with their shapes or Young's moduli while the lower jig plate is supported by the columnar members, the lower jig plate bends by an amount of bending in accordance with the amount of strain. The strain amounts of the columnar members are adjusted to match the in-plane distribution of the load applied to the lower jig plate, and the lower jig plate bends by the amount of bending which matches said strain amounts of these, thereby the lower jig plate bends so that the load applied to each position of the lower jig plate is balanced out, and the load can be uniformly applied to the object.

Each of the columnar members may be a cylinder shape, a prism shape, a cone shape, or a pyramid shape. By configuring as such, the columnar members can be strained by an amount of strain in accordance with these shapes, and bending of the lower jig plate can be adjusted to the amount of bending which matches said amount of strain.

Preferably, the columnar members may include a first columnar member arranged at a position where a relatively smaller load is applied to the lower jig plate, and a second columnar member arranged at a position where a relatively larger load is applied to the lower jig plate; and a strain amount of the first columnar member may be smaller compared to a strain amount of the second columnar member. By supporting the lower jig plate with the first columnar member having a relatively smaller amount of strain at a position where the load applied to the lower jig plate is relatively small, a large supporting force can be provided to the lower jig plate by the first columnar member which makes the lower jig plate to bend less, and enables to increase the load applied to the lower jig plate. Also, by supporting the lower jig plate with the second columnar member having a relatively larger amount of strain at a position where the load applied to the lower jig plate is relatively large, a small supporting force can be provided to the lower jig plate by the second columnar member which makes the lower jig plate to bend more, and enables to reduce the load applied to the lower jig plate. Thereby, the lower jig plate is bent so that the load applied to each position of the lower jig plate is balanced out, and uniform load can be applied to the object.

Preferably, a cross sectional area of the first columnar member may be larger than a cross sectional area of the second columnar member. At the first columnar member having a relatively larger cross-sectional area, a strain of a relatively smaller strain amount occurs when the columnar members receive a certain load, also at the second columnar member having a relatively small cross-sectional area, a strain of a relatively larger strain amount occurs when the columnar members receive a certain load. Therefore, the first columnar member and the second columnar member can be strained by the amount of strain in accordance with the cross-sectional areas of these, and the lower jig plate can be adjusted to bend by the amount of bending in accordance with said amount of strain.

Preferably, the columnar members may be densely distributed at the position where the relatively smaller load is applied to the lower jig plate compared to the position where the relatively larger load is applied to the lower jig plate. By supporting the lower jig plate with a relatively large number of columnar members at a position where the load applied to the lower jig plate is relatively small, a large supporting force can be provided to the lower jig plate by these columnar members to make the lower jig plate less likely to bend, and the load applied to the lower jig plate can be increased. Also, by supporting the lower jig plate with a relatively small number of columnar members at a position where the load applied to the lower jig plate is relatively large, a small supporting force is provided to the lower jig plate by these columnar members which makes the lower jig plate bend easily, and the load applied to the lower jig plate can be decreased. Thereby, the lower jig plate is bent so that the load applied to each position of the lower jig plate is balanced out, and the load can be uniformly applied to the object.

DETAILED DESCRIPTION OF INVENTION

Hereinafter, the present disclosure is described based on embodiments shown in the figures.

Figure 1A:
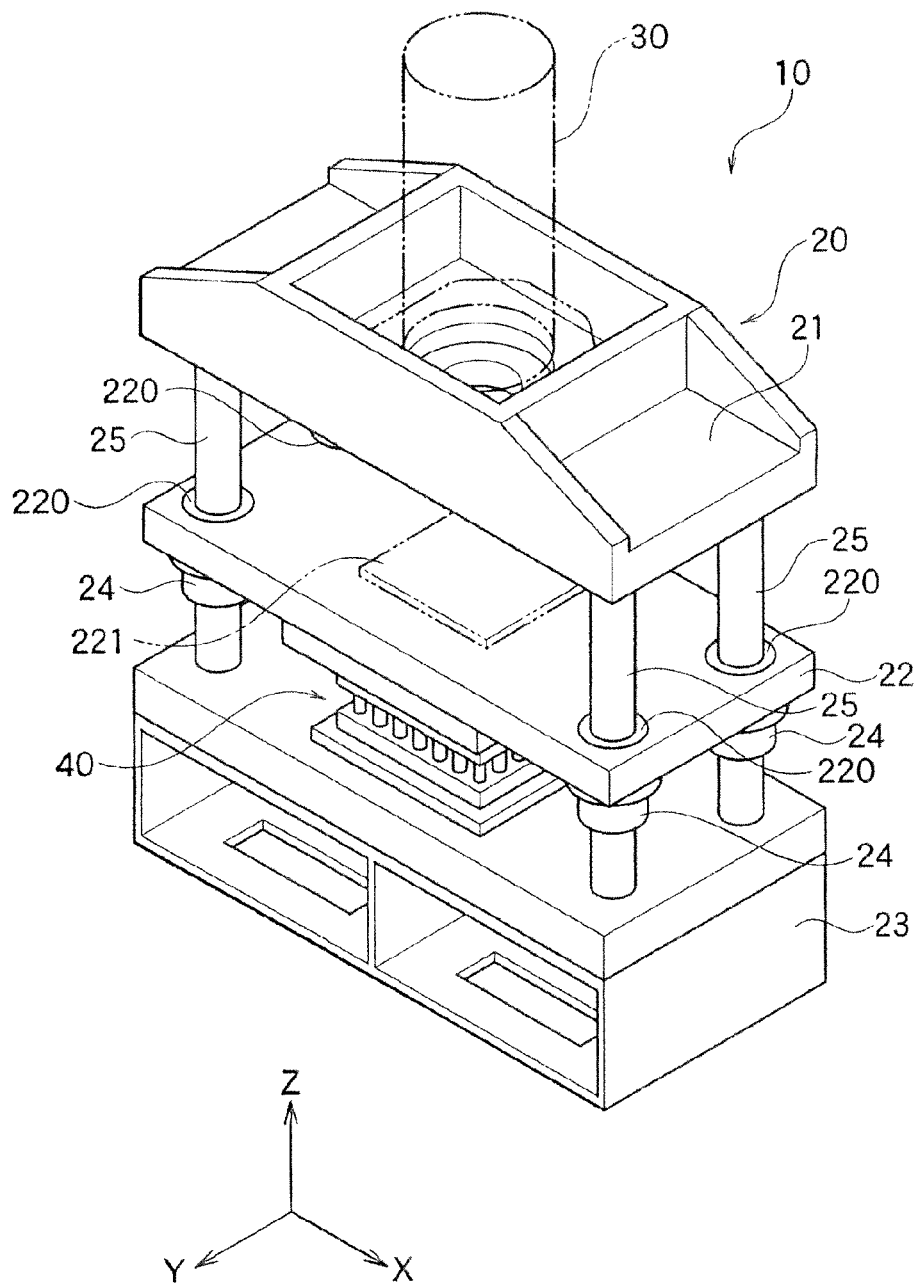
FIG. 1A is a perspective view of a substrate processing apparatus according to an embodiment of the present disclosure.

As shown in FIG. 1A, a substrate processing apparatus 10 according to an embodiment of the present disclosure is an apparatus for forming an element array 4 (FIG. 2) including elements 4a, 4b, and 4c on a substrate 2, and the substrate processing apparatus 10 presses the elements 4a, 4b, and 4c using a predetermined means against the substrate 2 on which the elements 4a, 4b, and 4c are arranged. Thereby, mechanical bonding strength and bonding stability between the substrate 2 and the elements 4a, 4b, and 4c can be enhanced. That is, the substrate processing apparatus 10 functions as a pressurizing portion (pressurizing device) when the element array 4 is formed on the substrate 2.

As a material of the substrate 2, for example, a glass epoxy material may be mentioned. Note that, the material of the substrate 2 is not limited thereto, and for example, the substrate 2 may be made of $SiO_2$ or $Al_2O_3$ as a glass substrate; or it may be a flexible substrate made of elastomers such as polyimide, polyamide, polypropylene, polyetheretherketone, urethane, silicone, polyethylene terephthalate, polyethylene naphthalate, or so; furthermore the substrate 2 may be a glass wool.

For example, a conductive bonding material, which is not shown in the figures, may be formed on the surface of the substrate 2 in advance. Due to anisotropic conductive particle connection, bump compression connection, or the like, this conductive bonding material electrically and mechanically connects the substrate 2 and the elements 4a, 4b, and 4c, and the conductive bonding material is cured by heating. As examples of the conductive bonding material, ACF, ACP, NCF, NCP, and the like may be mentioned. A thickness of the conductive bonding material may preferably be within a range of 1.0 to 10000 µm.

Circuit patterns are formed in a predetermined pattern on the substrate 2, and electrodes of the elements 4a, 4b, and 4c can be connected to the circuit patterns via the conductive bonding material.

The elements 4a, 4b, and 4c are arranged on the substrate 2 in an array form. An array form means that the elements 4a. 4b, and 4c are arranged in rows and columns according to a predetermined pattern, and spaces in the row direction and the column direction may be the same or different.

The elements 4a, 4b, and 4c are arranged as RGB pixels on a substrate for a display, and are arranged on a light emitting substrate as a backlight emitter. The element 4a is a red light emitting element, the element 4b is a green light emitting element, and the element 4c is a blue light emitting element. Note that, the elements arranged on the substrate 2 are not limited to these elements.

The elements 4a, 4b, and 4c of the present embodiment are micro light emitting elements (micro LED elements), and the size (width×length) thereof may, for example, be within a range of 5 µm×5 µm to 50 µm×50 µm. The thicknesses (heights) of the elements 4a to 4c may, for example, be 50 µm or less.

The substrate processing apparatus 10 includes a pedestal 20, a load generating portion 30, and a substrate pressurizing portion 40. In the figures, X axis corresponds to a width direction of the pedestal 20, Y axis corresponds to a depth direction of the pedestal 20, and Z axis corresponds to a height direction of the pedestal 20.

The pedestal 20 may be formed of, for example, a metal case, and includes a pedestal upper portion 21, a movable pressurizing portion 22, a pedestal lower portion 23, a guide bush 24, and a guide shaft 25. The pedestal lower portion 23 constitutes a base portion (table) of the pedestal 20 and has a predetermined height. In the example shown in the figures, a hollow portion is formed at inside of the pedestal lower portion 23. However, the shape of the pedestal lower portion 23 is not limited thereto, and inside of the pedestal lower portion 23 may be solid.

Lower ends of the four guide shafts 25 are fixed (inserted) to the four corners of the pedestal lower portion 23. These guide shafts 25 each have a predetermined length and is arranged so that it is standing upright in the Z-axis direction. A lower end of each guide shaft 25 is fixed to the pedestal lower portion 23, and an upper end of each guide shaft 25 is fixed to the pedestal upper portion 21. The guide shaft 25 penetrates the four corners of the movable pressurizing portion 22 arranged between the pedestal upper portion 21 and the pedestal lower portion 23. These guide shafts 25 function to support the pedestal upper portion 21 and also function to support the movable pressurizing portion 22 so that it can slide up and down in the Z-axis direction.

Figure 1B:
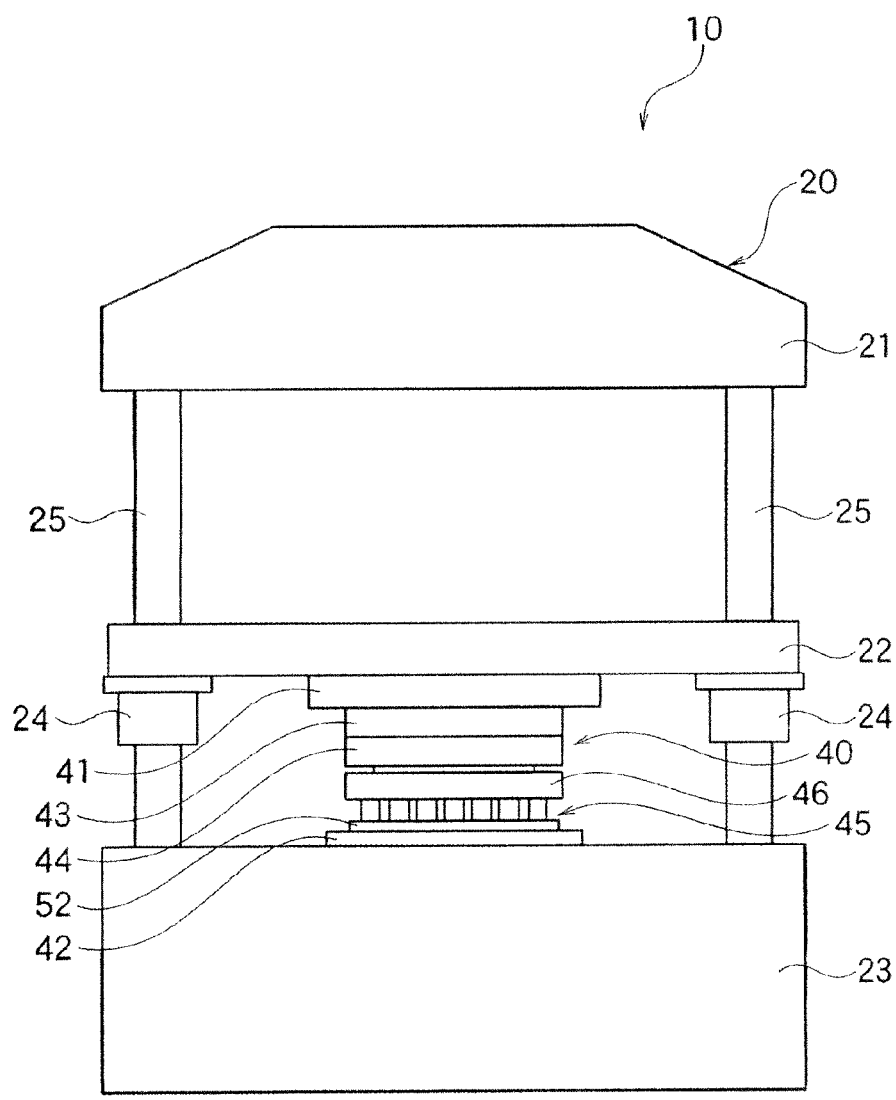
FIG. 1B is a side view of the substrate processing apparatus shown in FIG. 1A.

The movable pressurizing portion 22 is a plate-shaped body (rigid body) having a rectangular shape, and is positioned between the pedestal lower portion 23 and the pedestal upper portion 21. The movable pressurizing portion 22 is configured so that it can slide in a vertical direction along the four guide shafts 25 by receiving a load from the load generating portion 30. As shown in FIG. 1B, the movable pressurizing portion 22 contacts with an upper face of the substrate pressurizing portion 40 and applies pressure thereto, thereby, for example, load of about 0 to 100 kN or so is applied to the substrate pressurizing portion 40. Preferably, the movable pressurizing portion 22 may be parallel to the substrate pressurizing portion 40 and is in contact with the substrate pressurizing portion, and parallelism A of the movable pressurizing portion 22 against the substrate pressurizing portion 40 may preferably be within a range of 1 µm≤A<2 µm.

As shown in FIG. 1A, four through holes 220 are respectively formed at four corners of the movable pressurizing portion 22, and four guide shafts 25 are respectively inserted into the through holes 220. Four guide bushes 24 are fixed to the lower face (the face on the Z-axis negative direction side) of the movable pressurizing portion 22 at positions matching the four through holes 220. When the movable pressurizing portion 22 is moving in the vertical direction, the guide bush 24 functions to improve sliding of the movable pressurizing portion 22 (reduces friction against the guide shaft 25) and also functions to easily determine the position of the guide shaft 25 against the axis of the through hole 220.

The pedestal upper portion 21 configures a ceiling portion of the pedestal 20. The upper ends of the four guide shafts 25 are fixed (inserted) to the four corners of the lower face of the pedestal upper portion 21. A load generating portion 30 is fixed to a center portion of the pedestal upper portion 21. The load generating portion 30 is constituted by a device such as a pressurizing cylinder, a servo press, a motor, an actuator, or so, and functions to apply load to the movable pressurizing portion 22. Note that, in order to prevent the figures from becoming too complicated, the detailed configuration of the movable pressurizing portion 22 is not shown, and the configuration is only partly shown.

The load generating portion 30 applies load to the movable pressurizing portion 22 by applying pressure to a center area 221 of the movable pressurizing portion 22 using a press head (not shown in the figures). Thereby, the movable pressurizing portion 22 moves downward and applies pressure to the substrate pressurizing portion 40. As a result, the substrate pressurizing portion 40 can apply load to the object (the substrate 2 on which the elements 4a, 4b, 4c are arranged).

Figure 3A:
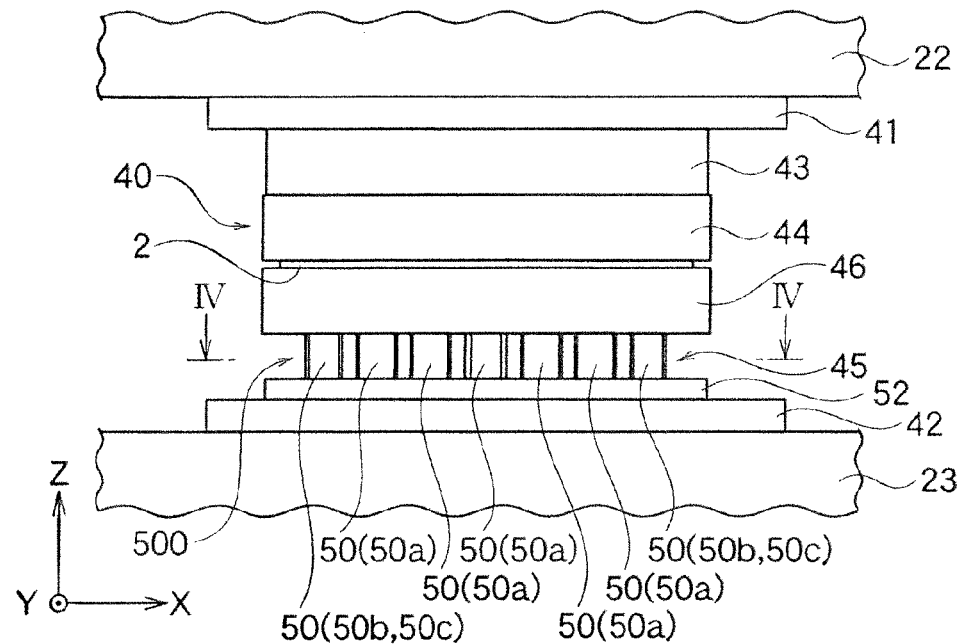
FIG. 3A is an enlarged side view of a substrate pressing portion of the substrate processing apparatus shown in FIG. 1A.

As shown in FIG. 3A, the substrate pressurizing portion 40 includes an upper stage 41, a lower stage 42, an upper mounting portion 43, an upper jig plate 44, a support member 45, and a lower jig plate 46. The upper stage 41 is provided on the lower face of the movable pressurizing portion 22, and the lower stage 42 is provided on the upper face of the pedestal lower portion 23. A thickness of each of the upper stage 41 and the lower stage 42 is thicker than the thickness of the substrate 2. The upper stage 41 and the lower stage 42 have the same shapes, and a width of each of these in the X-axis direction is wider than widths of the upper mounting portion 43 and the support member 45 in the X-axis direction. Note that, the shapes of the upper stage 41 and the lower stage 42 are not limited to the shapes shown in the figures, and may be changed appropriately.

Preferably, the upper stage 41 may be formed of a flat plate-shaped body (rigid body) having a relatively high surface accuracy (for example, flatness, smoothness, or the like). For example, preferably a surface accuracy of the upper face of the upper stage 41 may be better than a surface accuracy of the lower face of the movable pressurizing portion 22; that is, in the upper surface of the upper stage 41, preferably unevenness may be less (i.e. smoother) and less angled against the horizontal plane (i.e. flatter) than the lower surface of the movable pressurizing portion 22.

As such, by fixing the upper stage 41 having excellent surface accuracy to the lower face of the movable pressurizing portion 22, when the upper mounting portion 43 is fixed to the lower face of the upper stage 41, the upper mounting portion 43 or the upper jig plate 44 mounted thereon can be stably arranged without being angled against the horizontal plane.

Preferably, the lower stage 42 may be a flat plate-shaped body (rigid body) and is preferably formed of a member having relatively high surface accuracy (for example, flatness, smoothness, or the like). For example, preferably the surface accuracy of the upper face of the lower stage 42 may be better than the surface accuracy of the upper face of the pedestal lower portion 23; that is, in the upper surface of the lower stage 42, preferably unevenness may be less (i.e. smoother) and less angled against the horizontal plane (i.e. flatter) than the upper surface of the pedestal lower portion 23.

As such, by fixing the lower stage 42 having excellent surface accuracy to the upper face of the pedestal lower portion 23, when the support member 45 is fixed to the upper face of the lower stage 42, the support member 45 or the lower jig plate 46 supported by the support member 45 can be stably arranged without being angled against the horizontal plane.

The upper mounting portion 43 has an appearance of a flat plate-like shape and is fixed to the lower face of the upper stage 41. The upper jig plate 44 is mounted on the upper mounting portion 43. The upper mounting portion 43 functions to support the upper jig plate 44.

The upper jig plate 44 is a flat plate-shaped body (rigid body) and is fixed (mounted) to the lower face of the upper mounting portion 43. The upper jig plate 44 functions to apply pressure on the substrate 2 arranged on the lower jig plate 46. A heating function (for example, a heater) is built in the upper jig plate 44, and when the substrate 2 is pressed by the upper jig plate 44, the substrate 2 can be heated by the upper jig plate 44. For example, when the conductive bonding material is used to connect the elements 4a, 4b, and 4c with the substrate 2, the elements 4a, 4b, and 4c can be firmly connected to the substrate 2 by heating the substrate 2, and bonding force between the substrate 2 and the elements 4a, 4b, and 4c arranged thereon can be enhanced.

Preferably, the upper jig plate 44 may be formed of a member having relatively high surface accuracy. Preferably, the surface accuracy of the lower face of the upper jig plate 44 may be, for example, better than the surface accuracy of the lower face of the upper stage 41; that is, in the lower surface of the upper jig plate 44, preferably unevenness may be less (i.e. smoother) and less angled against the horizontal plane (i.e. flatter) than the lower surface of the upper stage 41. A surface roughness Ra of the surface (particularly, the lower face) of the upper jig plate 44 may particularly preferably be Ra≤1 μm.

As such, by improving the surface accuracy of the upper jig plate 44, when the substrate 2 arranged on the lower jig plate 46 is pressed by the lower face of the upper jig plate 44, unevenness of load applied to the substrate 2 can be reduced, and a uniform load can be applied to the elements 4a, 4b, and 4c arranged on the substrate 2.

The lower jig plate 46 is a flat plate-shaped body (rigid body) and it is supported by the support member 45. The lower jig plate 46 and the upper jig plate 44 are about the same shapes, and the lower jig plate 46 and the upper jig plate 44 face against each other. The substrate 2, which is an object to be pressed, can be arranged on the lower jig plate 46. As similar to the upper jig plate 44, a heating function (for example, a heater) is built in the lower jig plate 46, and when the substrate 2 is pressed by the upper jig plate 44, the substrate 2 can be heated by the lower jig plate 46 (and the upper jig plate 44).

Preferably, the lower jig plate 46 may be formed of a member having relatively high surface accuracy. Preferably, the surface accuracy of the upper face of the lower jig plate 46 may be better than the surface accuracy of the upper surface of the lower stage 42; that is, in the upper face of the lower jig plate 46, preferably unevenness may be less (i.e. smoother) and less angled against the horizontal plane (i.e. flatter) than the upper surface of the lower stage 42.

A surface roughness Ra of the surface (particularly, the upper face) of the lower jig plate 46 may particularly preferably be Ra≤1 μm, as similar to the surface roughness Ra of the surface of the upper jig plate 44. Also, parallelism A between the lower jig plate 46 and the upper jig plate 44 may preferably be A≤1 μm.

As such, by improving the surface accuracy of the lower jig plate 46, when the substrate 2 arranged on the lower jig plate 46 is pressed by the lower face of the upper jig plate 44, the lower face of the upper jig plate 44 and the substrate 2 become parallel to each other (contact with each other), and the above-mentioned effect of enhancing uniform distribution of load applied to the substrate 2 can be obtained.

Even if a certain level of surface accuracy of the upper jig plate 44 and the lower jig plate 46 is secured, when the substrate 2 is pressurized using the upper jig plate 44, the lower jig plate 46 is bent to some extent, and the lower jig plate 46 and the upper jig plate 44 may not have sufficient contact property (adhesive property). Thus, it may become difficult to apply uniform load to the substrate 2 (or to the elements 4a, 4b, and 4c arranged on the substrate 2), and the bonding condition between the substrate 2 and the elements 4a, 4b, and 4c may vary.

That is, in relativity, the substrate 2 has an area where load changes in decreasing direction when a small surface pressure is applied, and an area where load changes in increasing direction when a large surface pressure is applied, hence the load distribution of substrate 2 becomes non-uniform. Therefore, in the substrate processing apparatus 10 according to the present embodiment, the support member 45 is provided with a means for solving the non-uniform load distribution when pressure is applied to the substrate 2. Hereinafter, the support member 45 will be described in detail.

The support member 45 is fixed to the upper face of the lower stage 42 and supports the lower jig plate 46. That is, in the present embodiment, the lower jig plate 46 is provided above the lower stage 42 by having the support member 45 in between. The support member 45 is configured so that it can adjust the amount of load applied on the substrate 2 which is caused by bending of the above-mentioned lower jig plate 46; and the support member 45 provides a support force to the lower jig plate 46 in accordance with the in-plane distribution of the load applied to the lower jig plate 46.

For example, in the lower jig plate 46, the closer a position is to a center of the lower jig plate 46, the more the lower jig plate 46 is bent in a concave shape and protrudes downward, the surface pressure applied to the position becomes relatively small. Thus, the load applied to the lower jig plate 46 may become relatively small in some cases. As such, at the position where load applied to the lower jig plate 46 is relatively small, the support member 45 provides a relatively large supporting force to the lower jig plate 46. Thereby, at a position close to the center area of the lower jig plate 46, the lower jig plate 46 bends less, and load applied to the lower jig plate 46 can be increased. As a result, load applied to the substrate 2 arranged on the lower jig plate 46 at this position can be increased.

Also, as the position of the lower jig plate 46 is farther away from the center area thereof, the surface pressure applied to the position becomes relatively large, and the applied load may become relatively large. As such, at a position where load applied to the lower jig plate 46 becomes relatively large, the support member 45 provides a small supporting force to the lower jig plate 46. Thereby, at the position farther away from the center area of the lower jig plate 46, the lower jig plate 46 bends easily, and load applied to the lower jig plate 46 can be reduced. As a result, load applied to the substrate 2 arranged on the lower jig plate 46 at the position can be reduced.

As such, the support member 45 adjusts bending of the lower jig plate 46 so that load applied to each position of the lower jig plate 46 are balanced out, and uniform load can be applied to the substrate 2. Hereinafter, a specific means for providing the lower jig plate 46 with a supporting force in accordance with the in-plane distribution of load of the lower jig plate 46 using the support member 45 will be described.

The support member 45 includes a collective body 500 of columnar members 50 and an installation portion 52 where the columnar members 50 are placed. The columnar members 50 each have a columnar shape and function to support the lower jig plate 46. The shape of columnar member 50 is not limited thereto, and it may be a triangular prism shape, a square prism shape, any another polygonal prism shape, a cone shape, a triangular pyramid shape, or any another polygonal pyramid shape. The columnar member 50 may be a hollow shape.

Figure 4:
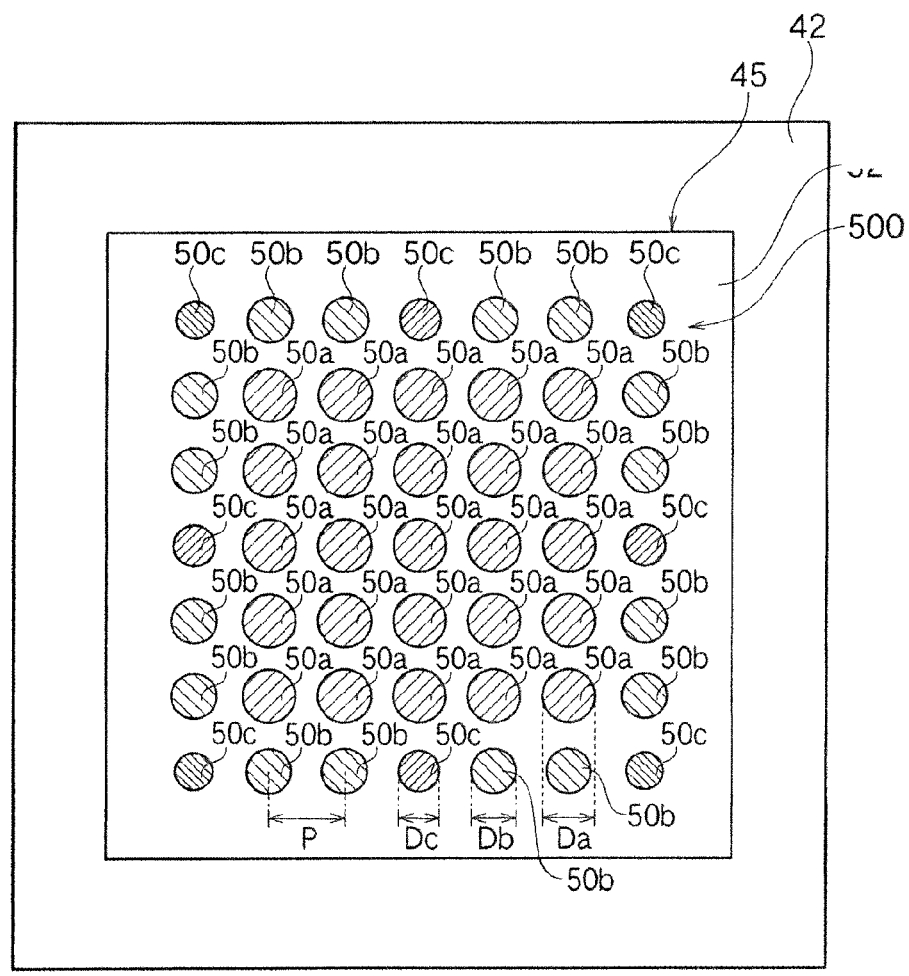
FIG. 4 is a cross sectional view of the substrate pressing portion shown in FIG. 3A along a line IV-IV.

Preferably, the columnar members 50 may be formed of a resiliently deformable solid body. As shown in FIG. 4, for example, the columnar members 50 are orderly arranged in a matrix form of 7 rows and 7 columns on the installation portion 52, and the columnar members 50 are arranged by taking predetermined space between each other in the X-axis direction and the Y-axis direction. In the example shown in the figures, the center distances between each of the columnar members 50 are substantially the same, and the columnar members 50 are arranged at equal space between each other, but the space between the columnar members 50 do not necessarily have to be the same. Also, when viewed from above, the columnar members 50 are evenly arranged from one end to the other end throughout X-axis direction and Y-axis direction of the installation portion 52, but the columnar members 50 may be unevenly distributed (concentrated) in part of the installation portion 52.

Also, the columnar members 50 may be arranged randomly on the installation portion 52 or may be arranged concentrically. The arrangement of the columnar members 50 is appropriately determined according to the in-plane distribution of the load applied to the lower jig plate 46.

In the present embodiment, the columnar members 50 do not necessarily all have the same cross-sectional areas (cross sectional areas parallel to the XY plane), and the columnar members 50 include a columnar member 50 having a relatively large cross sectional area (a columnar member 50a), a columnar member 50 having a relatively small cross sectional area (a columnar member 50c), and a columnar member 50 having a cross sectional area which is between these two (a columnar member 50b). That is, the columnar members 50 are formed of a plurality of members having different shapes.

The columnar members 50a are arranged at positions where load applied to the lower jig plate 46 is relatively small, and the columnar members 50b and 50c are arranged at positions where load applied to the lower jig plate 46 is relatively large. That is, the columnar members 50a, 50b, and 50c are arranged in accordance with the in-plane distribution of load applied to the lower jig plate 46.

In the example shown in the figures, the columnar members 50a are arranged on the installation portion 52 in a matrix form of 5 rows and 5 columns. In below, the columnar member 50a positioned at the center of the collective body of columnar members 50a may be specifically referred to as a columnar member 50a1. The columnar member 50a1 is arranged roughly at the center of the lower jig plate 46 (directly below the pressurizing shaft of the load generating portion 30). Note that, the pressurizing shaft may be configured of a single shaft or a plurality of shafts.

The columnar members 50b and the columnar members 50c are arranged at the outside of the collective body of columnar members 50a (the outermost periphery of the collective body 500) and surround the collective body. At the outermost periphery of the collective body 500, four columnar members 50c are arranged at four corners, and four more columnar members 50c are arranged between said four columnar members 50c. Further, two columnar members 50b are arranged in pairs between the columnar members 50c. The arrangement of the columnar members 50a, 50b, and 50c shown in FIG. 4 is an example, and the arrangement thereof may be appropriately changed.

When a width (diameter) of the columnar member 50a is Da, a width (diameter) of the columnar member 50b is Db, and a width (diameter) of the columnar member 50c is Dc, then Da>Db>Dc is satisfied. The diameters Da, Db, and Dc are preferably within a range of 10 to 20 mm. Also, a ratio Da/Dc is preferably within a range of 2/1 to 1.5/1 which is a ratio between the diameter Da of the columnar member 50a having largest diameter to the diameter Dc of the columnar member 50c having smallest diameter. By setting the diameter (thickness) of each of the columnar members 50a, 50b, and 50c within such range, each of the columnar members 50a, 50b, and 50c can bend appropriately in accordance with the magnitude or in-plane distribution of load applied to the lower jig plate 46.

Note that, among the columnar members 50a, a diameter of the columnar member 50a1 may be larger than that of other columnar members 50a so that the columnar member 50a1 becomes harder to bend compared to other columnar members 50a.

A center distance (pitch) P between the columnar members 50 may preferably be within a range of 20 to 50 mm, and more preferably within a range of 20 to 25 mm. By setting the center distance P between the columnar members 50 within such range, the columnar members 50a, 50b, and 50c can evenly support the entire lower jig plate 46, and the lower jig plate 46 can be supported with an appropriate supporting force. In the present embodiment, at the positions where the columnar members 50a, 50b, and 50c are arranged, a supporting force can be locally provided to the lower jig plate 46 by the columnar members 50a, 50b, and 50c.

A length L of the columnar members 50 may preferably be within a range of 20 to 50 mm, and more preferably within a range of 20 to 25 mm. The length L of the columnar members 50 may be substantially the same as the height of the lower jig plate 46.

When a cross sectional area of the columnar member 50a is Sa, a cross sectional area of the columnar member 50b is Sb, and a cross sectional area of the columnar member 50c is Sc, then Sa>Sb>Sc is satisfied. The cross-sectional area Sa of the columnar member 50a arranged at a position where load applied to the lower jig plate 46 is relatively small is larger than the cross-sectional areas Sb and Sc of the columnar members 50b and 50c arranged at positions where load applied to the lower jig plate 46 is relatively large.

In the case that the lower jig plate 46 is supported by the columnar members 50a, 50b, and 50c, load is applied to the lower jig plate 46 (FIG. 3A) by applying pressure to the substrate 2 using the upper jig plate 44 (FIG. 3A), and also load is applied to the columnar members 50a, 50b and 50c; a relatively small amount of strain (compression strain in the Z-axis negative direction) is generated to the columnar member 50a. At the same time, relatively large amount of strain (compression strain in the Z-axis negative direction) is generated to the columnar members 50b and 50c. As such, in the present embodiment, when load is applied to the columnar members 50a, 50b, and 50c, strain is generated to the columnar members 50a, 50b, and 50c by an amount of strain in accordance with these cross-sectional area Sa, Sb, and Sc.

The columnar members 50a, 50b, and 50c can freely expand and contract along an extending direction thereof by deforming in accordance with the cross-sectional area thereof when load is applied. The moment at which the columnar members 50a, 50b, and 50c deform by receiving load is roughly the same as the moment at which the lower jig plate 46 receives load from the upper jig plate 44, the moment at which the upper jig plate 44 receives load from the movable pressurizing portion 22, or the moment at which the movable pressurizing portion 22 receives load from the load generating portion 30. When no load is applied to the columnar members 50a, 50b, and 50c, the columnar members 50a, 50b, and 50c are not deformed and these are at the original state.

In the present embodiment, the amount of strain of the columnar member 50a arranged at a position where a relatively small load is applied to the lower jig plate 46 is smaller than the amounts of strain of the columnar members 50b and 50c arranged at positions where a relatively large load is applied to the lower jig plate 46. That is, in the columnar members 50, a strain gradient is formed in accordance with the in-plane distribution of load applied to the lower jig plate 46; and the closer the columnar member 50 is arranged to the center of the lower jig plate 46, the smaller the strain is; and the closer the columnar member 50 is arranged to the outer periphery of the lower jig plate 46, the larger the strain is.

Figure 3B:
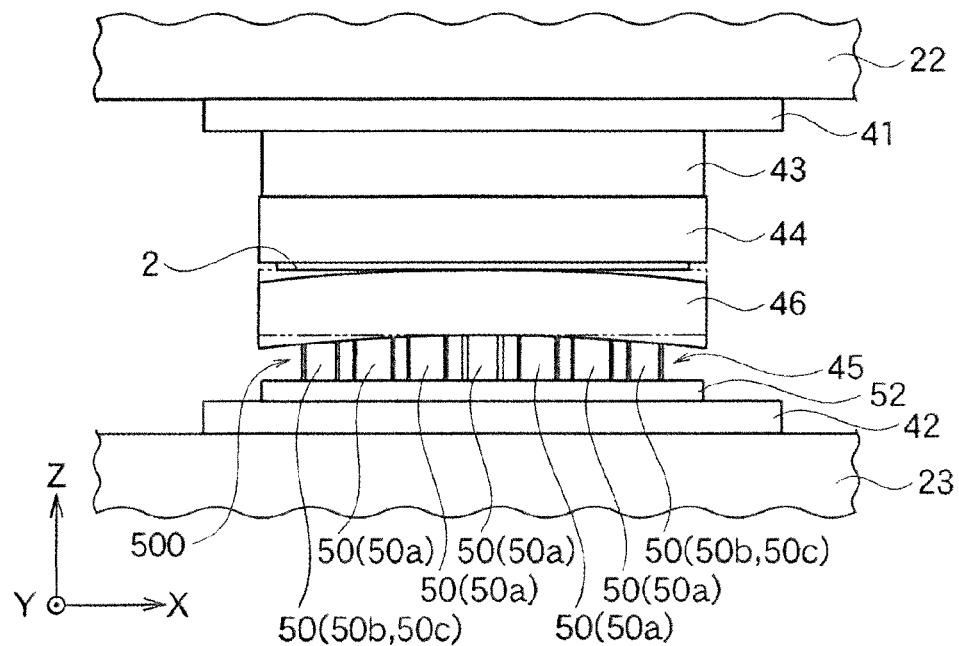
FIG. 3B is an enlarged side view showing when the lower jig plate of the substrate pressing portion shown in FIG. 3A is bent.

By supporting the lower jig plate 46 with the columnar member 50a having a relatively small strain amount at a position where load applied to the lower jig plate 46 is relatively small, a relatively large supporting force can be provided to the lower jig plate 46 by the columnar member 50a so that the lower jig plate 46 bend less, and the amount of bending of the lower jig plate 46 can be adjusted to be small amount in accordance with the strain amount of columnar member 50a. That is, if no measures are taken, the center area of the lower jig plate 46 is bent in a concave shape, but in the present embodiment, bending becomes relatively small as shown in FIG. 3B. As a result, load applied to the lower jig plate 46 can be increased, and the amount of load applied to the substrate 2 arranged on the lower jig plate 46 can be increased.

Also, by supporting the lower jig plate 46 with the columnar members 50b and 50c having relatively large strain amounts at position where the load applied to the lower jig plate 46 is relatively large, relatively small supporting force can be provided to the lower jig plate 46 by the columnar members 50b and 50c, so that the lower jig plate 46 bends easily, and bending of the lower jig plate 46 can be adjusted to a large amount of bending in accordance with the amounts of strain of the columnar members 50b and 50c. That is, if no measures are taken, the outer peripheral area of the lower jig plate 46 is hardly bent, but in the present embodiment, bending becomes relatively large as shown in FIG. 3B. As a result, load applied to the lower jig plate 46 can be reduced, and the amount of load applied to the substrate 2 arranged on the lower jig plate 46 can be reduced.

Figure 5A:
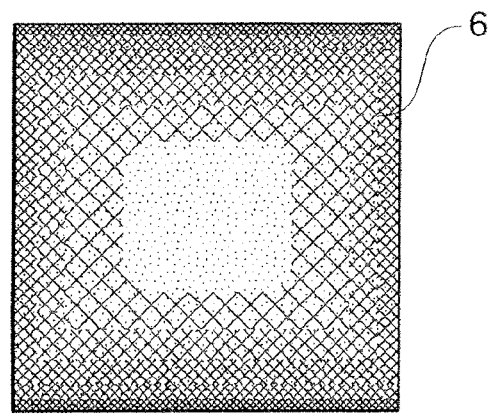
FIG. 5A is a diagram showing an in-plane distribution of load applied to a pressure sensitive paper when the lower jig plate is not supported by columnar members.
Figure 5B:
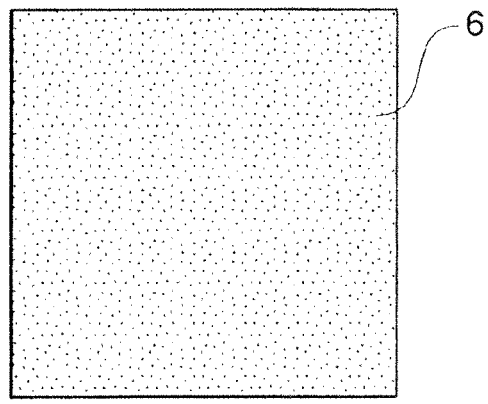
FIG. 5B is a diagram showing an in-plane distribution of load applied to the pressure sensitive paper when the lower jig plate is supported by the columnar members.

FIG. 5A is a diagram showing a distribution of load applied to the pressure sensitive paper 6 arranged on the lower jig plate 46 when the lower jig plate 46 (FIG. 3A) is mounted on a flat plate-shaped member (a member corresponding to the upper mounting portion 43) without using the support member 45 of the present embodiment (that is, FIG. 5A shows a comparative example). Also, FIG. 5B is a diagram showing a distribution of load applied to the pressure sensitive paper 6 arranged on the lower jig plate 46 when the lower jig plate 46 is supported by the support member 45 of the present embodiment (that is, FIG. 5B shows an example). In FIGS. 5A and 5B, the distribution of the load applied to the pressure sensitive paper 6 matches the distribution of load applied to the substrate 2. In these figures, a portion with a darker color indicates that a relatively large load is applied, and a portion with a lighter color indicates that a relatively small load is applied.

As shown in FIG. 5A, in a comparative example, the closer it is to the center area of the pressure sensitive paper 6, load applied to the pressure sensitive paper 6 decreases in relativity; on the other hand, the closer it is to the outer peripheral area of the pressure sensitive paper 6, load applied to the pressure sensitive paper 6 increases in relativity. That is, in a comparative example, a relatively large bending is generated around the center area of the lower jig plate 46, while a relatively small bending is generated around the outer periphery of the lower jig plate 46.

On the contrary, as shown in FIG. 5B, in an example, load is uniformly applied to the pressure sensitive paper 6 at each position of the pressure sensitive paper 6. In the present embodiment, as shown in FIG. 3B, by bending the lower jig plate 46 so that load applied to each position of the lower jig plate 46 is balanced out, the in-plane distribution of load applied to the lower jig plate 46 can be adjusted to be uniform as shown in FIG. 5B, and uniform load can be applied to the substrate 2 arranged on the lower jig plate 46.

The example shown in FIG. 4 shows an embodiment in which the in-plane distribution of load applied to the lower jig plate 46 is adjusted based on the difference of the strain amounts of the columnar members 50a, 50b, and 50c having different cross-sectional areas, however the embodiment for carrying out such adjustment is not limited thereto.

Figure 6A:
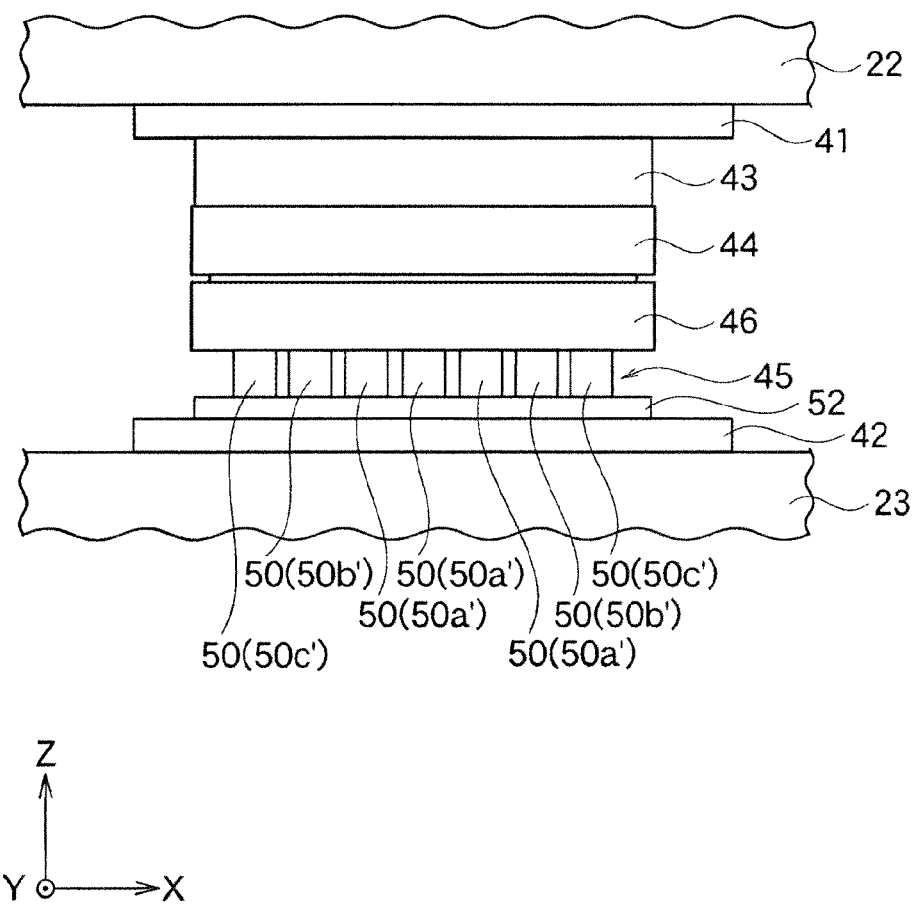
FIG. 6A is an enlarged side view showing a modification example of the support member shown in FIG. 3A.

For example, the support member 45 may adjust the in-plane distribution of load applied to the lower jig plate 46 by differences in the strain amounts based on the Young's moduli of the columnar members 50 when a certain load is applied. In the example shown in FIG. 6A, the columnar members 50a', 50b', and 50c' are made of members having different Young's moduli (mechanical strengths) or different hardness.

More specifically, the columnar member 50a' having a relatively large Young's modulus is arranged near the center area of the lower jig plate 46 where load applied to the lower jig plate 46 is relatively small. Also, the columnar member 50c' having a relatively small Young's modulus is arranged near the outer peripheral area of the lower jig plate 46 where load applied to the lower jig plate 46 is relatively large. Also, the columnar member 50b' having a relatively moderate Young's modulus is arranged at a position between the center area and the outer peripheral area of the lower jig plate 46 where load applied to the lower jig plate 46 is relatively moderate. That is, the Young's modulus of each of the columnar members 50a', 50b' and 50c' is in accordance with the in-plane distribution of load applied to the lower jig plate 46, and the Young's moduli of the columnar members 50 have a gradient in Which the Young's moduli become smaller at a position farther away from the center area of the lower jig plate 46. Note that, the cross-sectional areas and shapes of the columnar members 50a', 50b', and 50c' are all the same.

In this case, when the lower jig plate 46 is supported by the plurality of columnar members 50a', 50b', and 50c', load is applied to the lower jig plate 46 by applying pressure to the substrate 2 using the upper jig plate 44. Along with that, load is applied to the columnar members 50a', 50b', and 50c', then the columnar members 50a', 50b', and 50c' are strained in accordance with the Young's moduli of the columnar members 50a', 50b', and 50c', and the lower jig plate 46 bends by the amount of bending in accordance with the stain amounts of the columnar members 50a', 50b', and 50c'.

That is, since a relatively small strain is generated to the columnar member 50a', a relatively small bending is generated to the center area of the lower jig plate 46. Also, since a relatively large strain is generated to the columnar member 50e, a relatively large bending is generated to the outer peripheral area of the lower jig plate 46. Also, since a relatively moderate strain is generated to the columnar member 50b', a relatively moderate bending is generated at a position between the center area and the outer peripheral area of the lower jig plate 46.

As described above, the columnar members 50a', 50b', and 50c' are strained in accordance with the in-plane distribution of load applied to the lower jig plate 46, and the lower jig plate 46 bends in accordance with the strain amounts of the columnar members 50a', 50b', and 50c', thereby the lower jig plate 46 can bend so that load applied to each position of the lower jig plate 46 is balanced out (see FIG. 3B), and a uniform load can be applied to the substrate 2.

The Young's moduli E of the columnar members 50 may preferably be within a range of 100 GPa to 500 GPa. Also, a ratio Emax/Emin may preferably be within a range of 2/1 to 411 in which Emax represents the Young's modulus E of the columnar member 50a' having the largest Young's modulus and Emin represents the Young's modulus E of the columnar member 50c' having the smallest Young's modulus. By setting the range of the Young's modulus of each of the columnar members 50a', 50b', and 50c' within such range, the columnar members 50a', 50b', and 50c' can be bent appropriately in accordance with the in-plane distribution of the load applied to the lower jig plate 46. Note that, the support member 45 may include another columnar member 50 having a Young's modulus different from that of the columnar members 50a', 50b', and 50c'.

As a material having the Young's modulus described in above, the columnar members 50 are preferably made of a material such as carbon steel, silicon nitride, or silicon carbide.

Figure 6B:
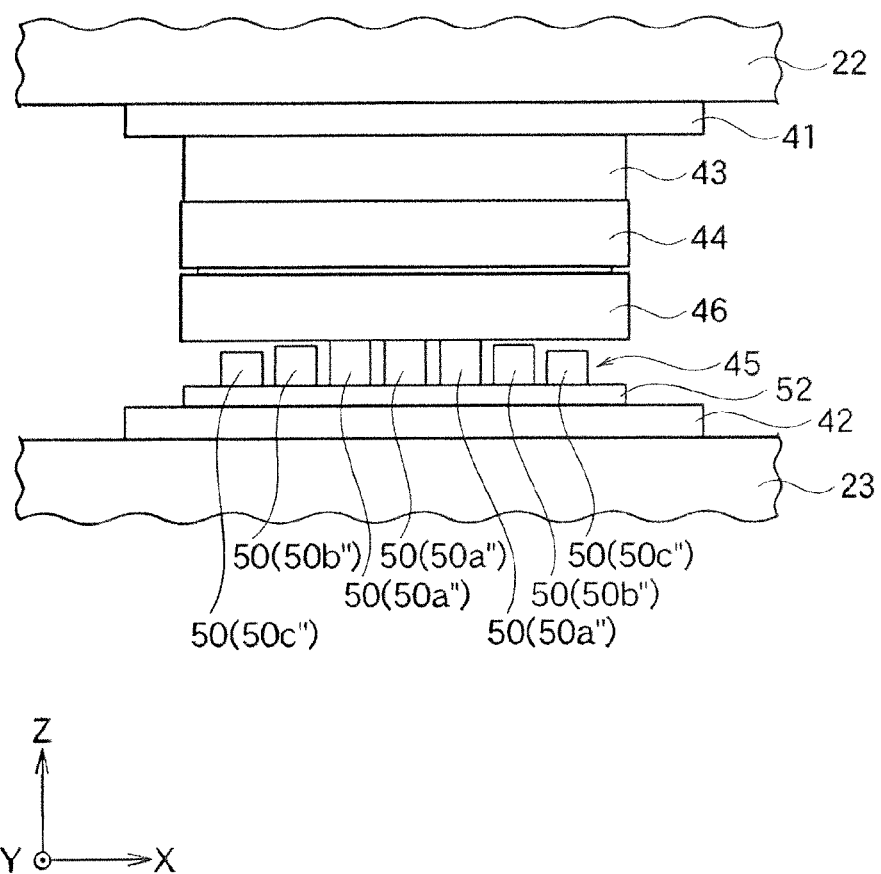
FIG. 6B is an enlarged side view showing another modification example of the support member shown in FIG. 3A.

Also, for example, the support member 45 may adjust the in-plane distribution of load applied to the lower jig plate 46 by differences in lengths of the columnar members 50. In the example shown in FIG. 6B, columnar members 50a", 50b", and 50c" are formed of members having different lengths, and a height distribution is formed at a height position of an upper end of the columnar members 50a", 50b", and 50c".

More specifically, the columnar member 50a" having a relatively long length is arranged closer to the center area of the lower jig plate 46 where the load applied to the lower jig plate 46 is relatively small. Also, the columnar member 50c" having a relatively short length is arranged around the outer peripheral area of the lower jig plate 46 where the load applied to the lower jig plate 46 is relatively large. Also, a columnar member 50b" having a relatively moderate length is arranged at a position between the center area and the outer peripheral area of the lower jig plate 46 where the load applied to the lower jig plate 46 is relatively moderate. That is, the length of each of the columnar members 50a", 50b", and 50c" has a value which matches the in-plane distribution of the load applied to the lower jig plate 46, and the lengths of the columnar members 50 (the height position of the upper end) are arranged so that a height gradient is formed which becomes shorter as it is further away from the center area of the lower jig plate 46. Note that, the cross-sectional areas and Young's moduli of the columnar members 50a", 50b", and 50c" are all the same.

In this case, when the lower jig plate 46 is supported by the columnar members 50a", 50b", and 50c", load is applied to the lower jig plate 46 by applying pressure to the substrate 2 using the upper jig plate 44. Along with that, load is applied to the columnar members 50a", 50b", and 50c", and the lower jig plate 46 bends in accordance with the lengths of the columnar members 50a", 50b", and 50c".

That is, relatively small bending is generated to the area close to the center of the lower jig plate 46 where the columnar member 50a" is arranged. Also, a relatively large bending is generated to the outer peripheral area of the lower jig plate 46 where the columnar member 50c" is arranged. Also, a relatively moderate bending is generated at a position between the center area and the outer peripheral area of the lower jig plate 46 where the columnar member 50b" is arranged. As such, the columnar members 50a", 50b", and 50c" having different lengths are arranged in accordance with the in-plane distribution of load applied to the lower jig plate 46, and the lower jig plate 46 is bent by the amount of bending in accordance with the lengths of the columnar members 50a", 50b", and 50c" thereby the lower jig plate 46 bends in a way that the load applied to each position of the lower jig plate 46 is balanced out (see FIG. 3B), and a uniform load can be applied to the substrate 2. Note that, the support member 45 may include other columnar members 50 having a length different from that of the columnar members 50a", 50b", and 50c".

Note that, bending of the lower jig plate 46 can be done more easily and more accurately by adjusting the material (Young's modulus) or the diameter (cross-sectional area) of the columnar members 50 than by adjusting the height of the columnar members 50.

The arrangement of the columnar members 50 is not limited to the example shown in FIG. 4, and for example, the columnar members 50 may be arranged as shown in FIGS. 7A, 8A, 9A, and 10A. In the example shown in FIG. 7A, nine columnar members 50d are arranged in a matrix form of 3 rows and 3 columns in a center area 520 of the installation portion 52 which is indicated by a dotted line. Also, columnar members 50e are locally arranged at outside the center area 520 of the installation portion 52. The columnar members 5od and 50e are arranged so as to extend radially from the center of the installation portion 52. The columnar members 50d are arranged in a relatively high density at the center area 520 of the installation portion 52, and the columnar members 50e are arranged in a relatively low density at outside of the center area 520 of the installation portion 52.

Figure 7A:
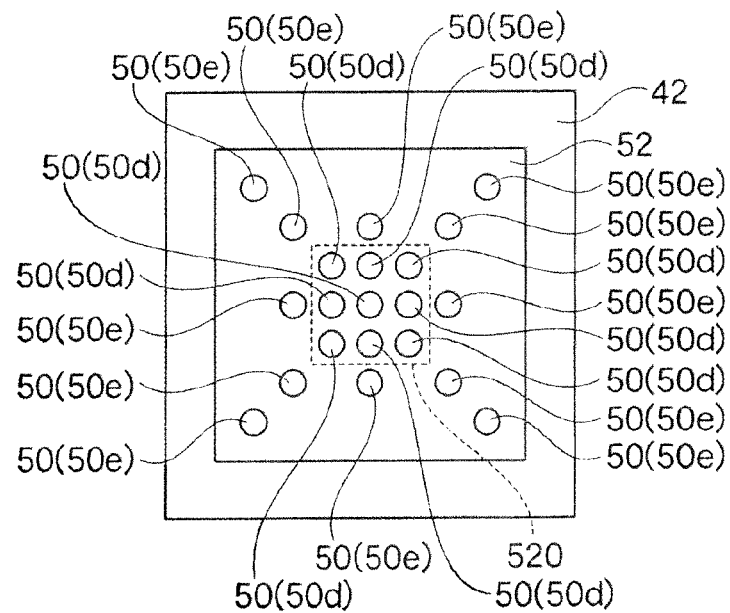
FIG. 7A is a diagram showing another arrangement example of the columnar members.

That is, in the example shown in FIG. 7A, at a position (central region 520) where load applied to the lower jig plate 46 (FIG. 1B) is relatively small, a relatively more columnar Members 50d are densely arranged than at a position (outside of the center area 520) where the load applied to the lower jig plate 46 is relatively large.

Figure 7B:
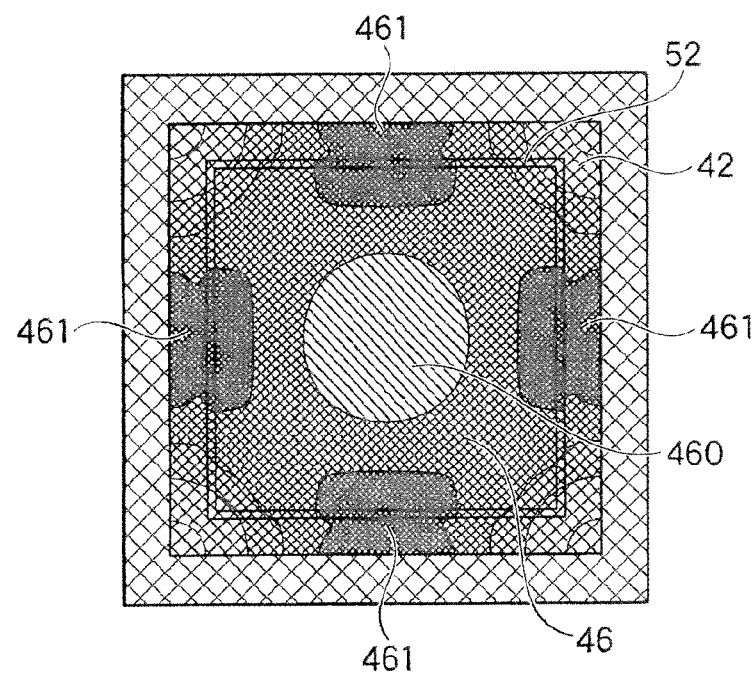
FIG. 7B is a diagram showing an in-plane distribution of load applied to the substrate or the lower jig plate when the columnar members are arranged in an arrangement shown in FIG. 7A.

FIG. 7B shows a result of analyzing a distribution of bending generated to the lower jig plate 46 using CAE (Computer Aided Engineering) analysis when the lower jig plate 46 is supported by the columnar members 50d and 50e shown in FIG. 7A. In these figures, a portion with a darker color indicates a relatively large bending, and a portion with a lighter color indicates that a relatively small deflection.

As shown in FIG. 7B, since the center area 460 of the lower jig plate 46 which matches the center area 520 of the installation portion 52 is supported by a relatively more columnar members 50d, at the center area 460, a relatively large supporting force is provided to the lower jig plate 46 by the columnar members 50d, thus the lower jig plate 46 bends less. That is, in the center area 460, bending generated to the lower jig plate 46 is adjusted to a small bending amount in accordance with the density (number) of the columnar members 50d, and a relatively small bending is generated to the center area 460. As a result, the load applied to the lower jig plate 46 increases.

On the other hand, since the area outside the center area 460 of the lower jig plate 46 is supported by a relatively fewer columnar members 50e, in this area, a relatively small supporting force is provided to the lower jig plate 46 by the columnar members 50e, thus the lower jig plate 46 tends to bend easily. That is, in the area outside the center area 460, bending generated to the lower jig plate 46 is adjusted to a large bending amount in accordance with the density (number) of the columnar members 50e, and a relatively large bending is generated to the area. As a result, the load applied to the lower jig plate 46 decreases.

In particular, in the side area 461 of the lower jig plate 46 which is not supported by the columnar member 50e, the lower jig plate 46 bends particularly easily, and the amount of bending of the lower jig plate 46 is particularly large compared to other areas.

As such, by arranging the columnar members 50d and 50e in accordance with the in-plane distribution of load applied to the lower jig plate 46, bending of the lower jig plate 46 is adjusted in accordance with the arrangement of the columnar members 50d and 50e so that load applied to each position of the lower jig plate 46 is balanced out, and a uniform load can be applied to the substrate 2 arranged on the lower jig plate 46.

Figure 8A:
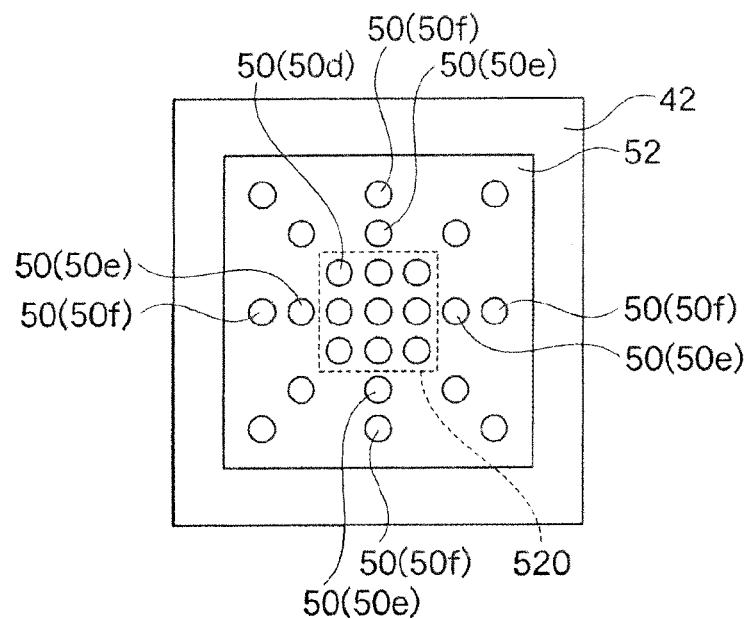
FIG. 8A is a diagram showing another arrangement example of the columnar members.

In the example shown in FIG. 8A, in addition to the columnar members 50d and 50e shown in FIG. 7A, columnar members 50f (four of them) are arranged on the installation portion 52. Each of the additionally arranged columnar members 50f is arranged adjacent to the outside of the four columnar members 50e arranged outside of the center area 520.

Figure 8B:
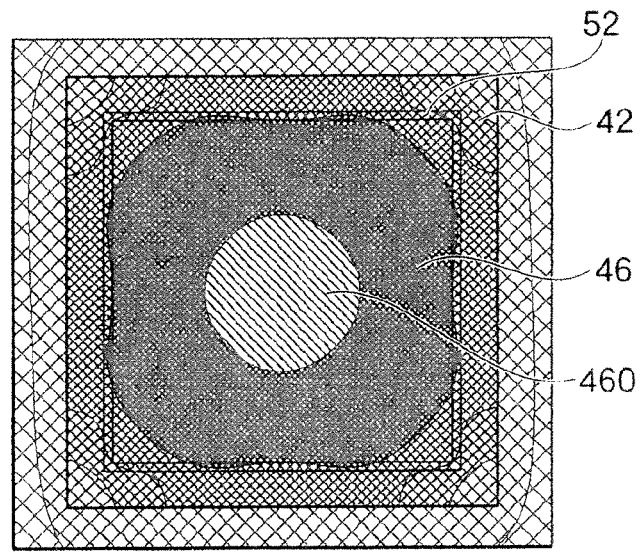
FIG. 8B is a diagram showing an in-plane distribution of load applied to the substrate or the lower jig plate when the columnar members are arranged in an arrangement shown in FIG. 8A.

Also in this case, as shown in FIG. 8B, relatively small bending is generated to the center area 460 of the lower jig plate 46, while relatively large bending is generated to outside the center area 460, which is as similar to FIG. 8A. The lower jig plate 46 shown in FIG. 8B bends across a wider area at outside of the center area 460 compared to the lower jig plate 46 shown in FIG. 7B.

Figure 9A:
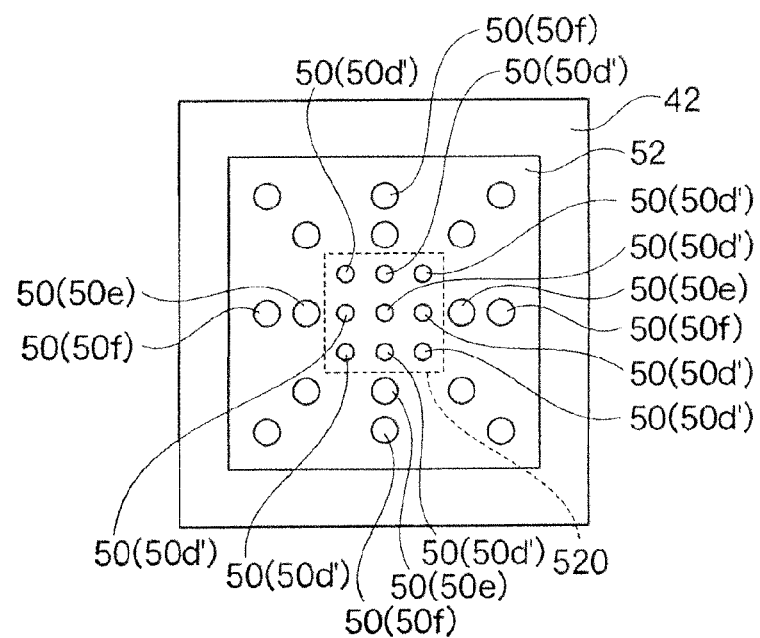
FIG. 9A is a diagram showing another arrangement example of the columnar members.

In the example shown in FIG. 9A, the columnar members 50d', 50e, and 50f are arranged on the installation portion 52 in the same arrangement as shown in FIG. 8A. Note that, the diameters of the columnar members 5od' arranged on the center area 520 of the installation portion 52 are smaller than the diameters of the columnar members 50e and 50f arranged on outside the center area 520.

Figure 9B:
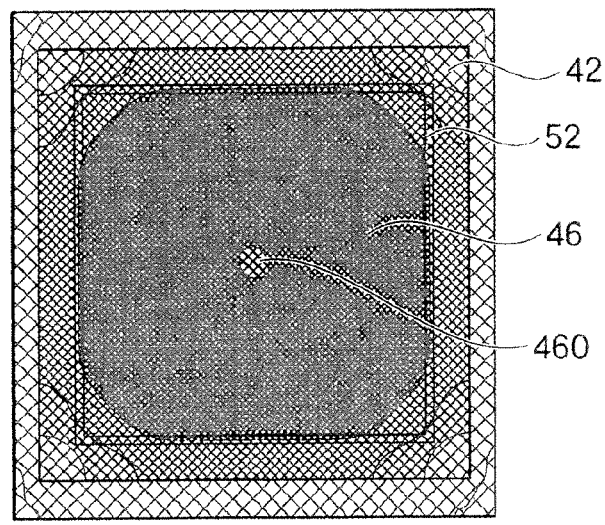
FIG. 9B is a diagram showing an in-plane distribution of load applied to the substrate or the lower jig plate when the columnar members are arranged in an arrangement shown in FIG. 9A.

In this case, compared to the example shown in FIG. 8A, the supporting force provided to the center area 460 of the lower jig plate 46 by the columnar members 50d' decreases, thus, as shown in FIG. 9B, the center area 460 of the lower jig plate 46 bends more compared to the lower jig plate 46 shown in FIG. 8B.

Figure 10A:
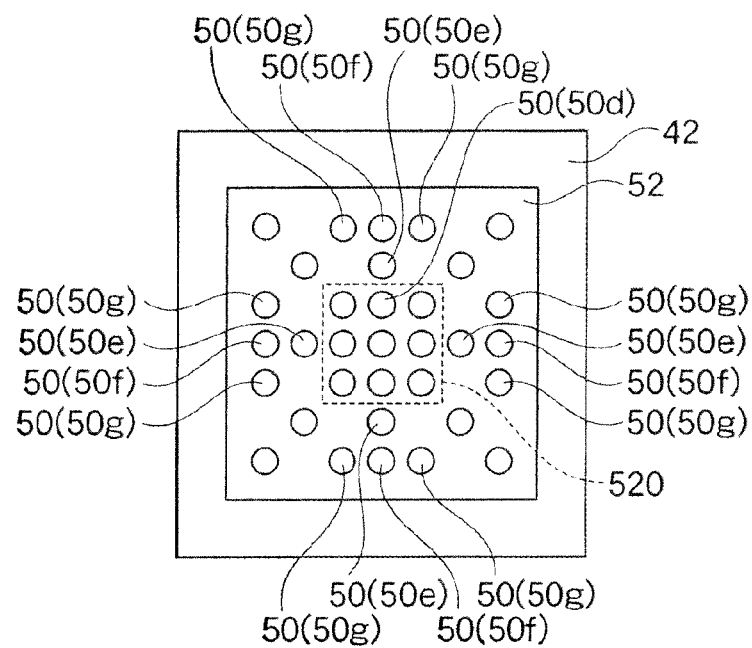
FIG. 10A is a diagram showing another arrangement example of the columnar members.
Figure 10B:
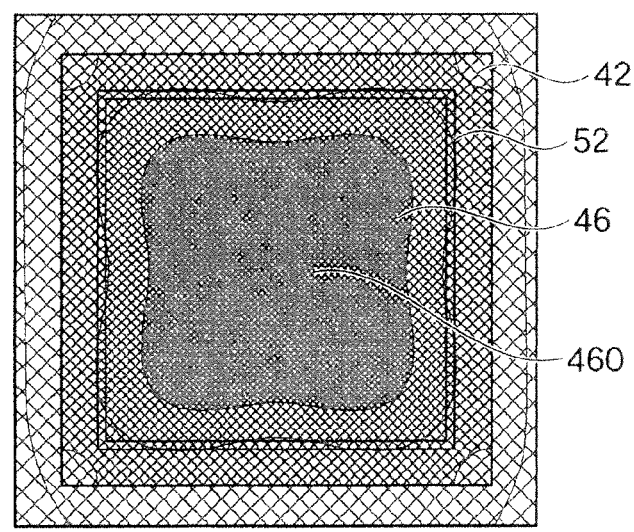
FIG. 10B is a diagram showing an in-plane distribution of load applied to the substrate or the lower jig plate when the columnar members are arranged in an arrangement shown in FIG. 10A.

In the example shown in FIG. 10A, in addition to the columnar members 50d, 50e, and 50f shown in FIG. 8A, columnar members 50g (eight of them) are arranged on the installation portion 52. Each of the additionally arranged columnar members 50g is arranged adjacent to the four columnar members 50f arranged outside the center area 520.

In this case, a relatively large bending is generated to the center area 460 of the lower jig plate 46, while a relatively small bending is generated to outside of the center area 460. As such, when the columnar members 50g are additionally arranged on the installation portion 52, the in-plane distribution of load applied to the lower jig plate 46 is adjusted to have an in-plane distribution opposite of the in-plane distribution of load shown in FIGS. 7B, 8B, and 9B.

Depending on the in-plane distribution of load applied to the lower jig plate 46, the columnar members 50 are appropriately installed to the installation portion 52 using at least one arrangement shown in FIGS. 4, 7A, 8A, 9A, and 10A. Note that, the columnar members 50 may be installed to the installation portion 52 in an arrangement other than the arrangements shown in FIGS. 4, 7A, 8A, 9A, and 10A.

Also, as described above, when the lower jig plate 46 is not supported by the support member 45, there is a problem, that is, the closer it is to the center area of the lower jig plate 46, the larger the relative bending of the lower jig plate 46 becomes, and the closer it is to the outer periphery of the lower jig plate 46, the smaller the relative bending of the lower jig plate 46 becomes. The above-mentioned embodiments have solved such problem. When the lower jig plate 46 is not supported by the support member 45, there may be a case that the closer it is to the center area of the lower jig plate 46, the smaller the relative bending becomes, and the closer it is to the outer peripheral area of the lower jig plate 46, the larger the relative bending becomes. In this case, the in-plane distribution of the load applied to the lower jig plate 46 is roughly the opposite of the in-plane distribution of load shown in FIG. 5A, and load applied to the center area of the lower jig plate 46 becomes relatively large, while load applied to the outer peripheral area of the lower jig plate 46 becomes relatively small.

In such case, the material (Young's modulus), shape, arrangement, and so on of the columnar members 50 arranged on the installation portion 52 may be selected appropriately so that the columnar member 50 arranged closer to the center area of the lower jig plate 46 has a larger strain and the columnar member 50 arranged closer to the outer peripheral area of the lower jig plate 46 has a smaller strain. For example, for the columnar members 50 arranged closer to the center area of the lower jig plate 46, those with smaller Young's modulus or smaller diameter may be used; and for the columnar members 50 arranged closer to the outer peripheral area of the lower jig plate 46, those with larger Young's modulus or larger diameter may be used.

When the lower jig plate 46 is supported by the columnar members 50 having such strain characteristics, the lower jig plate 46 bends easily at a position closer to the center area, and load applied to the lower jig plate 46 can be reduced. As a result, load applied to the substrate 2 arranged on lower jig plate 46 at said position can be also reduced.

Also, at a position closer to the outer periphery of the lower jig plate 46, the lower jig plate 46 bends less, and the load applied to the lower jig plate 46 can be increased. As a result, the load applied to the substrate 2 arranged on the lower jig plate 46 at said position can be increased.

As shown in FIG. 3A, the installation portion 52 is formed of a plate-shaped body having a roughly flat plate shape, and functions to support the columnar members 50 so that the columnar members 50 are held upright. The installation portion 52 has installation holes (not shown in the figures) for installing the columnar members 50. Lower ends of the columnar members 50 can be inserted into and fixed to the installation holes. The number of installation holes may be the same as the number of columnar members 50, or may be more than the number of columnar members 50. Each of the columnar members 50 may be fixed to the installation portion 52 (installation hole) using a connecting member such as a bolt, or may be fixed to the installation portion 52 (installation hole) using a connecting member such as an adhesive.

Note that, the installation holes are not essential to the installation portion 52, and the columnar members 50 may be fixed using a joining member or a connecting member to the surface of the installation portion 52 having a planar shape (flat shape). Alternatively, the columnar members 50 may simply be in contact with the surface of the installation portion 52. Among the columnar members 50 shown in FIG. 4, the columnar member 50a1 positioned at the center may preferably be fixed to the installation portion 52 using a joining member, an adhesive member, or the like.

Also, the columnar member 50a1 may preferably be fixed to the lower face of the lower jig plate 46 using a joining member, an adhesive member, or the like. By fixing only the columnar member 50a1 among the columnar members 50 to the lower face of the lower jig plate 46, bending of the lower jig plate 46 can be adjusted to be small at the center area of the lower jig plate 46, and the load applied to the lower jig plate 46 can be made relatively large.

As described above, in the substrate processing apparatus 10 according to the present embodiment, as shown in FIG. 3A, the support member 45 includes the columnar members 50 that support the lower jig plate 46. For each of the columnar members 50, the physical parameters such as space between each other, position of arrangement, diameter, length, and so on can be adjusted appropriately. By supporting the lower jig plate 46 with the columnar members 50, a supporting force can be provided to the lower jig plate 46 in accordance with the physical parameters of the columnar members 50, and bending of the lower jig plate 46 can be adjusted so that a uniform load is applied to the lower jig plate 46, thus a uniform load can be applied to the substrate 2 and the elements 4a, 4b, and 4c arranged thereon.

Note that, the present disclosure is not limited to the above-described embodiments, and various modifications can be made within the scope of the present disclosure.

In the above embodiments, all of the columnar members 50 were a columnar shape. However, one of the columnar members 50 may be a columnar shape, and other columnar members may be a polygonal columnar shape, a conical shape, a polygonal pyramid shape, or the like. The columnar members 50 having such shapes have different strain amounts when a certain load is applied. Therefore, also in this case, similarly to the above embodiments, the support member 45 can adjust the in-plane distribution of the load applied to the lower jig plate 46 and adjust bending generated to the lower jig plate 46 by the stain amount differences based on the difference in the shapes of the columnar members 50.

In the above embodiment, the support member 45 may provide a support force to the lower jig plate 46 in accordance with the distribution of height of the substrate 2 on which the elements 4a, 4b, and 4c are arranged. The non-uniformity of the load applied to the substrate 2 may be caused by the distribution of height of the substrate 2. The distribution of height of the substrate 2 may be caused by differences in shapes or sizes of the elements 4a, 4b, and 4c, asymmetrical arrangement of the elements 4a, 4b, and 4c with respect to the substrate 2, deformation of the elements 4a, 4b, and 4c during pressurization, or the like. For example, if no measures are taken, a relatively small load may be applied at a position where the height of the substrate 2 is relatively low, and a relatively large load may be applied at a position where the height of the substrate 2 is relatively high (the opposite pattern may also occur).

Even in such a case, at a position where the height of the substrate 2 is relatively low, by arranging columnar members which does not strain easily, a relatively large supporting force is provided by the supporting member 45 (the columnar members 50) to the lower jig plate 46 so that the load applied to the lower jig plate 46 increases; and at a position where the height of the substrate 2 is relatively high, by arranging columnar members 50 which easily strain, a relatively small supporting force is provided by the supporting member 45 (the columnar members 50) to the lower jig plate 46 so that the load applied to the lower jig plate 46 decreases, thereby the load applied to each position of the lower jig plate 46 can be balanced out and a uniform load can be applied to the substrate 2.

Figure 2:
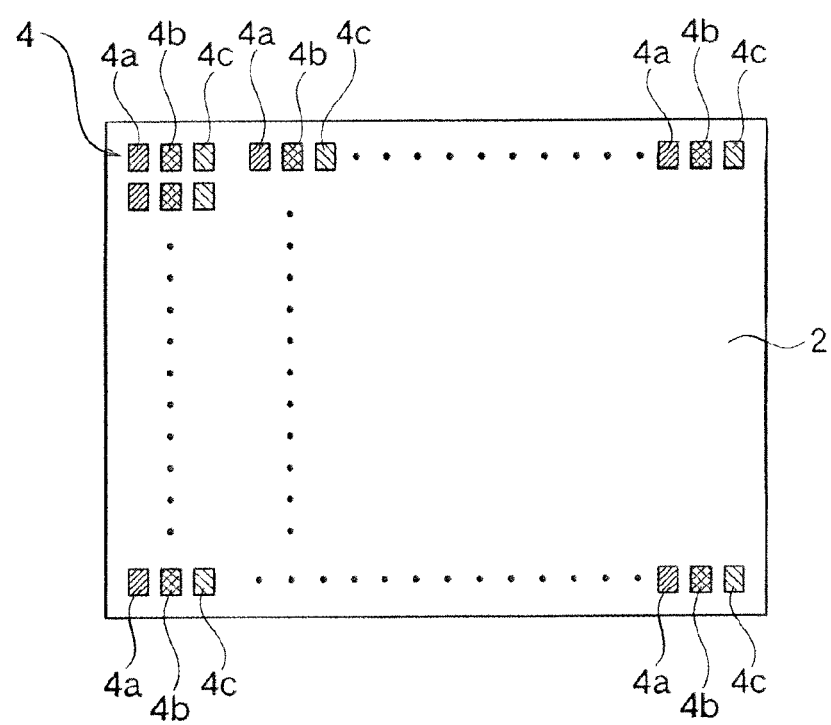
FIG. 2 is a diagram showing a substrate which is an object to be pressurized of the substrate processing apparatus shown in FIG. 1A.
Figure 2:
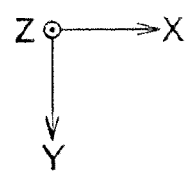

In the above embodiments, as shown in FIG. 2, the shape of the substrate 2 is a quadrangular shape, but it may be circular or other polygonal shapes.

DESCRIPTION OF THE REFERENCE NUMERICAL

2 . . . Substrate
4 . . . Element Array
4a, 4b, 4c . . . Elements
6 . . . Pressure sensitive paper
10 . . . processing apparatus
21 . . . Pedestal upper portion
27 . . . Movable Pressurizing portion
220 . . . Through hole
221 . . . Center area
23 . . . Pedestal lower portion
24 . . . Guide Bush
25 . . . Guide shaft
30 . . . Generating portion
40 . . . Pressurizing portion
41 . . . Upper stage
42 . . . Lower stage
43 . . . Upper mounting portion
44 . . . Upper jig plate
45 . . . member
46 . . . Lower jig plate
460 . . . Central area
461 . . . Side area
50, 50a to 50g . . . Columnar members
500 . . . Collective body
52 . . . Installation portion
520 . . . Center Area

What is claimed:

1. A substrate processing apparatus comprising
a lower jig plate for arranging an object to be pressurized,
an upper jig plate for pressurizing the object arranged on the lower jig plate, and
a support member supporting the lower jig plate and providing the lower jig plate with a supporting force in accordance with an in-plane distribution of a load applied to the lower jig plate, wherein
the support member includes columnar members supporting the lower jig plate,
the columnar members are formed of members having different shapes or Young's moduli, and the support member adjusts the in-plane distribution of the load applied to the lower jig plate by the columnar members having properties exhibiting different strain amounts when a certain load is applied, and
each of the columnar members is formed of a single columnar resiliently deformable solid body.

2. The substrate processing apparatus according to claim 1, wherein the support member provides the lower jig plate with a support force in accordance with a height distribution of the object.

3. The substrate processing apparatus according to claim 1, wherein the columnar members are arranged in accordance with the in-plane distribution of the load applied to the lower jig plate.

4. The substrate processing apparatus according to claim 1, wherein each of the columnar members have a cylinder shape, a prism shape, a cone shape, or a pyramid shape.

5. The substrate processing apparatus according to claim 1, wherein the columnar members comprise a first columnar member arranged at a position where a relatively smaller load is applied to the lower jig plate, and a second columnar member arranged at a position where a relatively larger load is applied to the lower jig plate; and
a strain amount of the first columnar member is smaller compared to a strain amount of the second columnar member.

6. The substrate processing apparatus according to claim 5, wherein a cross sectional area of the first columnar member is larger than a cross sectional area of the second columnar member.

7. The substrate processing apparatus according to claim 1, wherein the columnar members are densely distributed at the position where the relatively smaller load is applied to the lower jig plate compared to the position where the relatively larger load is applied to the lower jig plate.

8. The substrate processing apparatus according to claim 1, wherein a resilient deformation of the single columnar solid body according to the load applied to the lower jig plate changes a length of the single columnar solid body along an axial direction of the single columnar solid body.

9. The substrate processing apparatus according to claim 3, wherein in the columnar members, a strain gradient is formed in accordance with the in-plane distribution of the load applied to the lower jig plate, and
an amount of strain of the columnar members increases or decreases from a center of the lower jig plate to an outer periphery of the lower jig plate.

* * * * *